US012640203B2

(12) United States Patent
Tay et al.

(10) Patent No.: US 12,640,203 B2
(45) Date of Patent: May 26, 2026

(54) ADAPTIVE WORDLINE START VOLTAGE USING WORDLINE SAMPLING

(71) Applicant: Micron Technology, Inc., Boise, ID (US)

(72) Inventors: Yee Yang Tay, Singapore (SG); Pey Chyi Tang, Singapore (SG); Jiejuan Liu, Singapore (SG); Yuan Jun Teng, Singapore (SG); Hwei Ean Lim, Singapore (SG)

(73) Assignee: MICRON TECHNOLOGY, INC., Boise, ID (US)

( * ) Notice: Subject to any disclaimer, the term of this patent is extended or adjusted under 35 U.S.C. 154(b) by 18 days.

(21) Appl. No.: 18/945,159

(22) Filed: Nov. 12, 2024

(65) Prior Publication Data

US 2025/0166706 A1 May 22, 2025

Related U.S. Application Data

(60) Provisional application No. 63/600,390, filed on Nov. 17, 2023.

(51) Int. Cl.
| | |
|---|---|
| *G06F 12/00* | (2006.01) |
| *G06F 12/02* | (2006.01) |
| *G11C 16/08* | (2006.01) |
| *G11C 16/10* | (2006.01) |
| *G11C 16/04* | (2006.01) |

(52) U.S. Cl.
CPC .......... *G11C 16/08* (2013.01); *G06F 12/0246* (2013.01); *G11C 16/10* (2013.01); *G11C 16/0483* (2013.01)

(58) Field of Classification Search
CPC ..... G11C 16/08; G11C 16/10; G11C 16/0483; G06F 12/0246
USPC .......................................... 711/103
See application file for complete search history.

(56) References Cited

U.S. PATENT DOCUMENTS

| | | | | | |
|---|---|---|---|---|---|
| 5,748,545 | A | * | 5/1998 | Lee ........................ | G11C 29/02 |
| | | | | | 365/189.11 |
| 2004/0208071 | A1 | * | 10/2004 | Mukunoki ............. | G11C 29/12 |
| | | | | | 365/201 |
| 2021/0118485 | A1 | * | 4/2021 | Lim ................... | G11C 13/0004 |
| 2021/0280244 | A1 | * | 9/2021 | Dasgupta ............. | G11C 13/003 |

* cited by examiner

*Primary Examiner* — Mardochee Chery
(74) *Attorney, Agent, or Firm* — NICHOLSON DE VOS WEBSTER & ELLIOTT LLP

(57) ABSTRACT

Methods, systems, and apparatuses include sampling a memory subportion of a portion of memory, where the memory subportion includes multiple wordlines. A sampled voltage value for the memory subportion is determined based on the sampling. A maximum start voltage delta is received for the memory subportion, where the maximum start voltage delta is an estimated difference between the sampled voltage value and a lowest voltage value for the memory subportion. A start voltage to apply during programming of the memory subportion is determined using the sampled voltage value and the maximum start voltage delta.

20 Claims, 6 Drawing Sheets

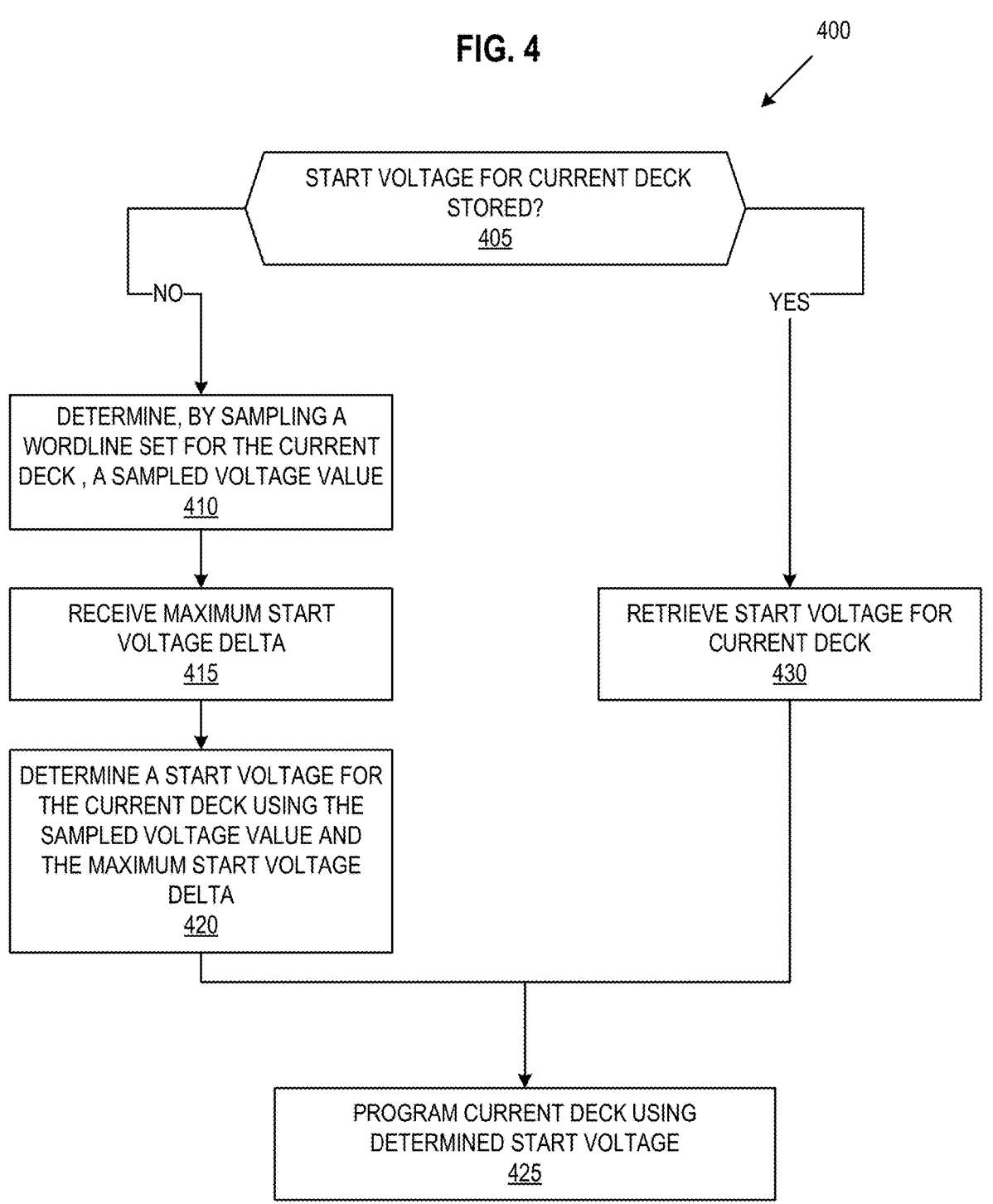

START VOLTAGE FOR CURRENT DECK STORED?
405

NO

YES

DETERMINE, BY SAMPLING A WORDLINE SET FOR THE CURRENT DECK , A SAMPLED VOLTAGE VALUE
410

RECEIVE MAXIMUM START VOLTAGE DELTA
415

DETERMINE A START VOLTAGE FOR THE CURRENT DECK USING THE SAMPLED VOLTAGE VALUE AND THE MAXIMUM START VOLTAGE DELTA
420

RETRIEVE START VOLTAGE FOR CURRENT DECK
430

PROGRAM CURRENT DECK USING DETERMINED START VOLTAGE
425

500

SAMPLE A MEMORY SUBPORTION OF A
PORTION OF MEMORY
505

DETERMINE, BASED ON THE SAMPLING, A
SAMPLED VOLTAGE VALUE FOR THE
MEMORY SUBPORTION
510

RECEIVE A MAXIMUM START VOLTAGE
DELTA FOR THE MEMORY SUBPORTION
515

DETERMINE A START VOLTAGE TO APPLY
DURING PROGRAMMING OF THE MEMORY
SUBPORTION USING THE SAMPLED
VOLTAGE VALUE AND THE MAXIMUM
START VOLTAGE DELTA
520

600

ADAPTIVE WORDLINE START VOLTAGE USING WORDLINE SAMPLING

CROSS-REFERENCE TO RELATED APPLICATION

The present application claims the benefit of U.S. Provisional Patent Application No. 63/600,390 filed on Nov. 17, 2023, which is incorporated by reference herein in its entirety.

TECHNICAL FIELD

The present disclosure generally relates to adaptive wordline start voltage, and more specifically, relates to adaptive wordline start voltage using wordline sampling.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 4 is a flow diagram of an example method to determine adaptive wordline start voltage using wordline sampling in accordance with some embodiments of the present disclosure.

DETAILED DESCRIPTION

Figure 1:
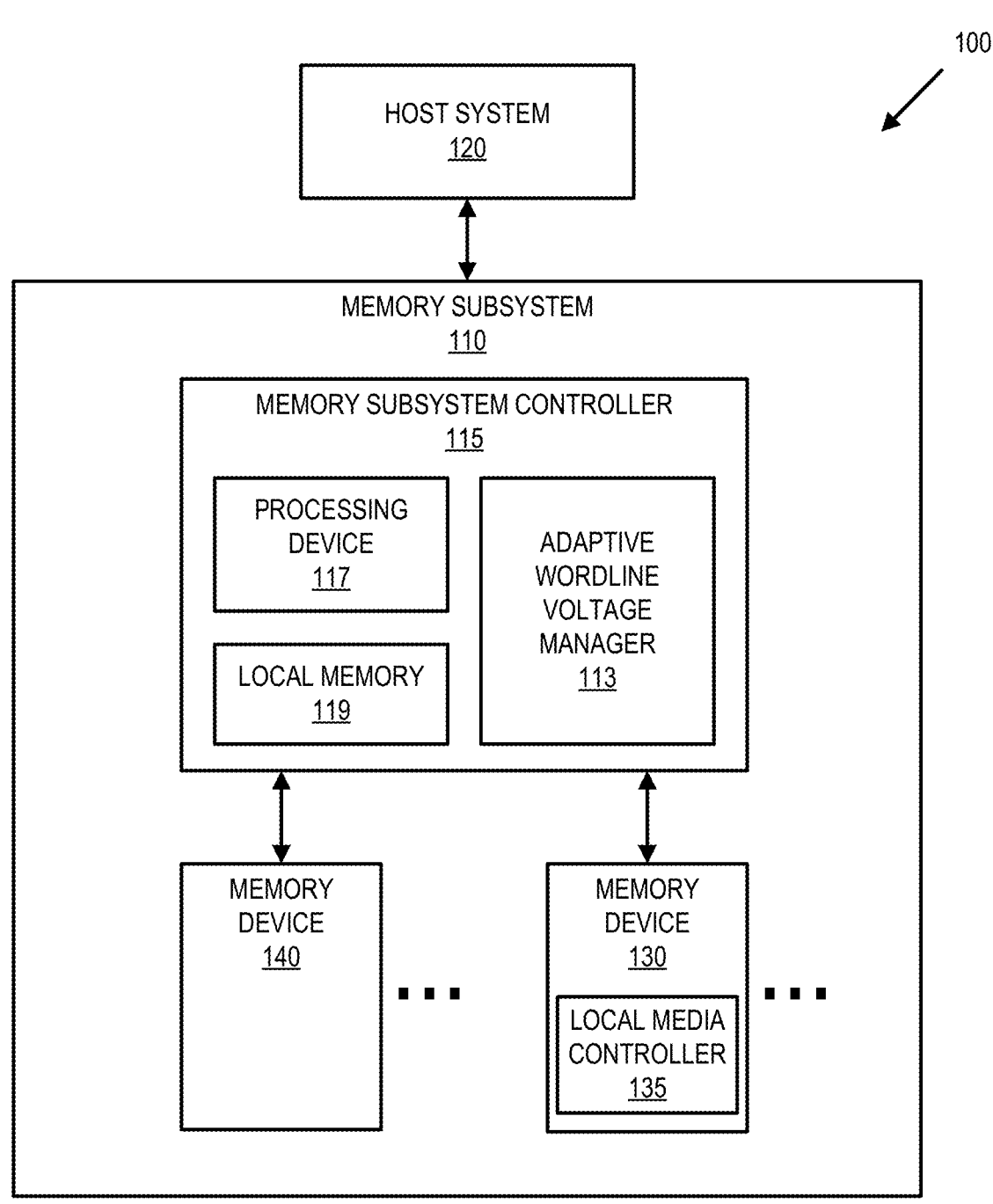
FIG. 1 illustrates an example computing system that includes a memory subsystem in accordance with some embodiments of the present disclosure.

Aspects of the present disclosure are directed to adaptive wordline start voltage using voltage sampling in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units identified by a logical unit number (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), quad-level cells (QLCs), and penta-level cells (PLCs). For example, an SLC can store one bit of information and has two logic states while a QLC can store sixteen bits of information and has sixteen logic states.

In conventional memory systems, memory controllers can use dynamic wordline start voltages that depend on how long the memory device has been running. This allows a memory controller to optimize programming time and wear on the memory device. For example, at the beginning of life for a memory device, the programming time is often slow but the wear on the memory device is minimal or non-existent. The memory controller can therefore increase the wordline start voltage during this time to decrease the programming time for the memory device. As time goes on, however, programming speed and wear on the memory device both increase. Accounting for this, after a threshold amount of time, the memory controller can reduce the wordline start voltage to reduce the wear on the memory device. Additionally, since wear can differ between blocks in a memory device, the memory controller determines a different wordline start voltage for each memory block. For example, in some systems, the memory controller samples every wordline in the memory block to determine its wear and therefore the wordline start voltage to apply. This sampling is time consuming but serves to prevent voltage overshoot during programming. In other systems, the memory controller instead samples select wordlines and uses these samples to determine the wordline start voltage to apply to the entirety of the memory block. This solution does not work for all memory devices and, in particular, causes voltage overshoot during programming in memory devices with large wordline start voltage variations between wordlines.

Aspects of the present disclosure address the above and other deficiencies by determining a wordline start voltage for a subportion of a memory device using wordline sampling and a maximum start voltage delta. For example, the maximum delta (or difference) between a maximum start voltage and a minimum start voltage for a memory block may be known. A memory subsystem can sample only a select number of wordlines in each deck of a memory block and determine a wordline start voltage to apply to the entirety of that deck based on the sampled wordline start voltage and the maximum delta. This allows the memory subsystem to reduce the programming time by only sampling a few wordlines while still protecting against voltage overshoot.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processing device such as a processor chipset and a software stack executed by the processor chipset. The processor chipset can include one or more cores, one or more caches, a memory controller (e.g., NVDIMM controller), and/or a storage protocol controller (e.g., a peripheral component interconnect express (PCIe) controller, a serial advanced technology attachment (SATA) controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a SATA interface, including a mini-SATA (mSATA) interface, a PCIe interface, including a mini PCIe (mPCIE) interface, a Non-Volatile Memory Express (NVMe) interface, a universal serial bus (USB) interface, an a Fibre Channel, Serial Attached SCSI (SAS), a Small Computer System Interface (SCSI), a double data rate (DDR) memory bus, a dual in-line memory module (DIMM) interface (e.g., DIMM socket interface that supports Double Data Rate (DDR)), an Advanced Host Controller (AHCI) interface, an Open NAND Flash Interface (ONFI) interface, a Double Data Rate (DDR) interface, a Low Power Double Data Rate (LPDDR) interface, any other interface, and/or combinations of these interfaces. The physical host interface can be used to transmit data between the host system 120 and the memory subsystem 110. The host system 120 can further utilize an NVMe interface to access components (e.g., memory devices 130 and 140) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via the same communication connection, multiple separate communication connections, and/or a combination of communication connections.

The memory devices 130 and 140 can include any combination of the different types of non-volatile memory devices and/or volatile memory devices. The volatile memory devices (e.g., memory device 140) can be, but are not limited to, random-access memory (RAM), such as dynamic random-access memory (DRAM), synchronous dynamic random-access memory (SDRAM), video random-access memory (VRAM), and cache memory.

Some examples of non-volatile memory devices (e.g., memory device 130) include negative-and (NAND) type flash memory devices and write-in-place type memory devices, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random-access memory (FeRAM), magneto random-access memory (MRAM), Spin Transfer Torque (STT)-MRAM, nano-RAM (NRAM), silicon-oxide-nitride-oxide-silicon (SONOS) memory, conductive bridging RAM (CBRAM), resistive random-access memory (RRAM), oxide based RRAM (OxRAM), negative-or (NOR) flash memory, and erasable programmable read-only memory (EPROM), including electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The buffer memory of subsystem controller 115 can include any of the volatile or non-volatile memory types mentioned above including combinations thereof. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in memory subsystem 110 (e.g., stored in a local memory 119). In some examples, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processing device or controller separate from the memory subsystem 110).

In general, the memory subsystem controller 115 can receive commands or operations from the host system 120 and can convert the commands or operations into instructions or appropriate commands to achieve the desired access to the memory devices (e.g., memory devices 130 and/or 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA) and/or namespace) and a physical address (e.g., physical block address) that are associated with the memory devices (e.g., memory devices 130 and/or 140). The memory subsystem controller 115 can further include host interface circuitry to communicate with the host system 120 via the physical host interface. The host interface circuitry can convert the commands received from the host system into command instructions to access the memory devices (e.g., memory devices 130 and/or 140) as well as convert responses associated with the memory devices into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices (e.g., memory devices 130 and/or 140).

In some embodiments, the memory devices (e.g., memory devices 130 and/or 140) include local media controllers 135 that operate in conjunction with memory subsystem controller 115 to execute operations on one or more memory cells of the memory devices (e.g., memory devices 130 and/or 140). An external controller (e.g., memory subsystem controller 115) can externally manage the memory devices (e.g., perform media management operations on the memory devices 130 and/or 140). In some embodiments, a memory device (e.g., memory device 130) is a managed memory device, which is a raw memory device combined with a local controller (e.g., local controller 135) for media management within the same memory device package. An example of a managed memory device is a managed NAND (MNAND) device.

The memory subsystem 110 includes an adaptive wordline voltage manager 113 that determines a wordline start voltage for a subportion of a memory device using a maximum start voltage delta and sampled wordlines in the memory device. In some embodiments, the controller 115 includes at least a portion of the adaptive wordline voltage manager 113. For example, the controller 115 can include a processing device 117 configured to execute instructions stored in local memory 119 for performing the operations described herein. In some embodiments, an adaptive wordline voltage manager 113 is part of the host system 120, an application, or an operating system.

The adaptive wordline voltage manager 113 determines a wordline start voltage for a deck of a memory block in a memory device using a maximum start voltage delta and samples a set of wordlines near the beginning of the deck (e.g., one or more of wordlines three through five of the deck). In some embodiments, at least a part of adaptive wordline voltage manager 113 is implemented in a memory device (e.g., memory device 130). Further details with regards to the operations of the adaptive wordline voltage manager 113 are described below.

Figure 2:
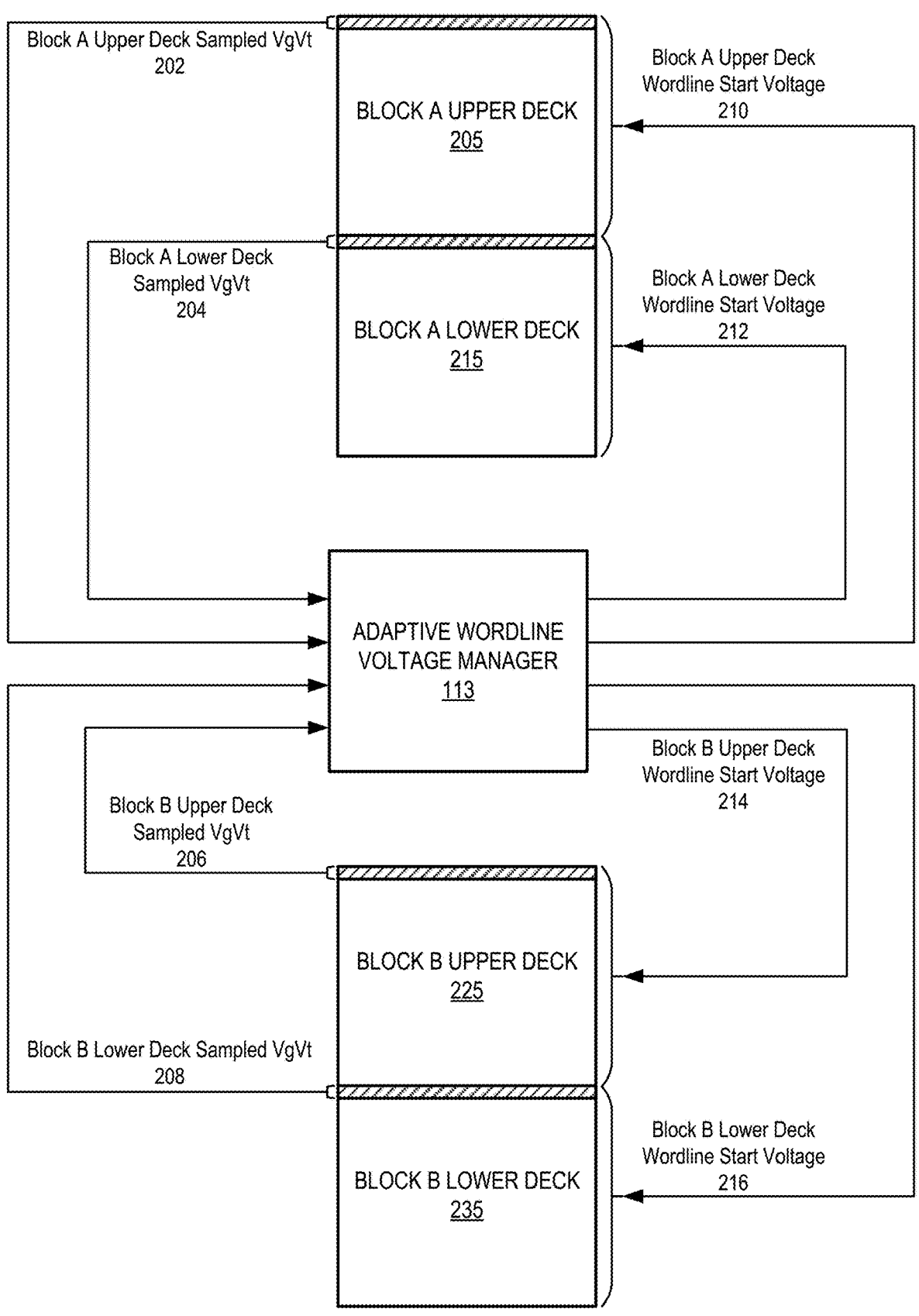
FIG. 2 illustrates another example computing system that includes an adaptive wordline voltage component in accordance with some embodiments of the present disclosure.

FIG. 2 illustrates another example computing system 200 that includes an adaptive wordline voltage component in accordance with some embodiments of the present disclosure. As shown in FIG. 2, adaptive wordline voltage manager 113 is coupled to memory block A and memory block B. Memory block A includes block A upper deck 205 and block A lower deck 215. Memory block B includes block B upper deck 225 and block B lower deck 235. Although only two memory blocks are illustrated, adaptive wordline voltage manager 113 can be coupled to any number of memory blocks in a memory device. Additionally, although block A upper deck 205, block A lower deck 215, block B upper deck 225, and block B lower deck 235 are illustrated as decks and halves of memory blocks A and B respectively, adaptive wordline voltage manager 113 can perform similar operations on any number and/or size of subdivisions of a memory device.

As an example, with reference to FIG. 2, adaptive wordline voltage manager 113 samples a select number of wordlines in block A upper deck 205. In some embodiments, adaptive wordline voltage manager 113 samples the select number of wordlines by receiving or determining the calibrated wordline start voltages for the wordlines during programming of block A. For example, adaptive wordline voltage manager 113 calibrates the wordline start voltage by determining a wordline start voltage for each consecutive wordline in a write request. In one embodiment, adaptive wordline voltage manager 113 starts the calibration for the first wordline of block A using a start voltage of 0 millivolts (mV) and determines a wordline start voltage based on the calibration. For example, adaptive wordline voltage manager 113 determines the calibrated wordline start voltage based on the sampled VgVT for the first wordline. Adaptive wordline voltage manager 113 then starts the calibration for the second wordline of block A using the determined wordline start voltage and determines a next wordline start voltage based on the calibration. Adaptive wordline voltage manager 113 stores the calibrated wordline start voltage for the most recent wordline in a local media controller (e.g., local media controller 135 of memory device 130 of FIG. 1). Adaptive wordline voltage manager 113 receives the calibrated wordline start voltages for the select number of wordlines from the local media controller. Adaptive word-line voltage manager 113 only samples a select number of wordlines and transfers wordline start voltages for the select number of wordlines to conserve time/memory resources.

For example, adaptive wordline voltage manager 113 determines a sampled voltage gate to voltage threshold (VgVt) voltage for wordlines of block A upper deck 205. The VgVt value for a wordline or other memory subdivision refers to the voltage difference between the gate voltage (Vg) for the wordline in an unprogrammed state and the Vg required to bring the memory subdivision to a voltage threshold (Vt) or programmed state. The programming volt-age threshold (Vt) represents the voltage "border" between logical states in a memory cell. For example, in an SLC memory device, the voltages below Vt correspond with data values of 0 and voltage at Vt or higher correspond with data values of 1.

Figure 3:
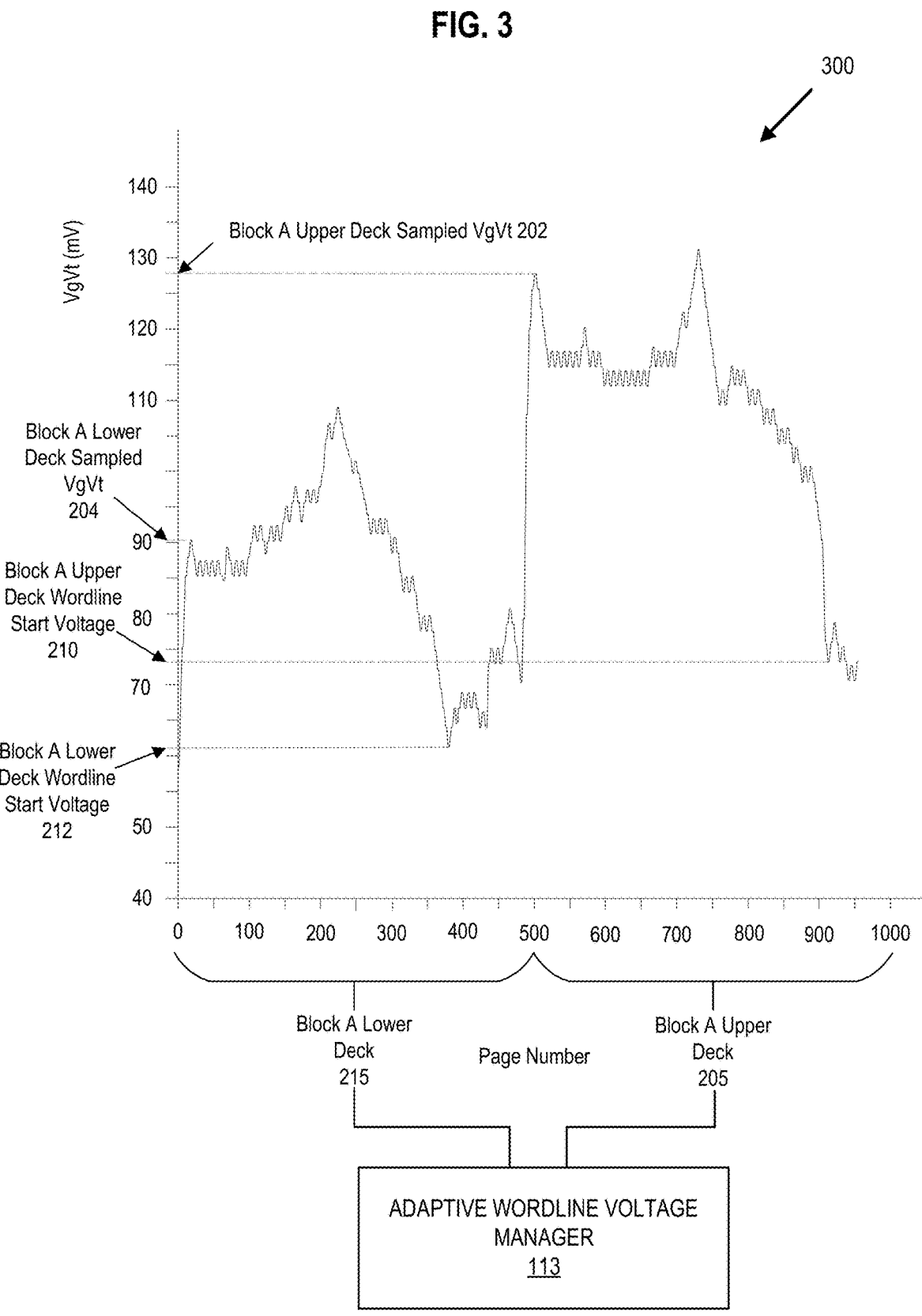
FIG. 3 is a graph of wordline start voltage and page number in accordance with some embodiments of the present disclosure.

FIG. 3 is a graph in accordance with some embodiments of the present disclosure. Graph 300 illustrates how VgVt values differ between wordlines in a deck and wordlines in a block. Graph 300 illustrates an exemplary VgVt distribu-tion for a memory block. As explained above, the VgVt distributions for different memory blocks can vary due to temperature differences, defects, manufacturing processes, uneven wear, and other variables. As shown in FIG. 3, graph 300 includes block A upper deck sampled VgVt 202, block A lower deck sampled VgVt 204, block A upper deck wordline start voltage 210, and block A lower deck wordline start voltage 212.

As shown in FIG. 3, wordlines within a memory device may have varying VgVt values. This variation may be due to temperature differences, defects, manufacturing pro-cesses, uneven wear, and other variables. Applying a con-stant wordline start voltage to wordlines with varying VgVt can cause wordlines with higher VgVt values to experience voltage overshoot and degrade more quickly. Adaptive wordline voltage manager 113 therefore samples VgVt for a wordline to ensure that the applied wordline start voltage will not result in voltage overshoot. Voltage overshoot can occur when a memory controller applies a higher wordline voltage than VgVt. Voltage overshoot is problematic because it leads to excess charge accumulation and degra-dation of memory devices.

Voltage overshoot is a problem especially for certain programming algorithms such as drain to source program-ming. During drain to source programming, the memory controller applies a positive voltage to the drain terminal and a negative voltage to the source terminal for the current wordline, causing the gate voltage (Vg) to increase to the threshold voltage (Vt). During drain to source programming, Vg is lower than it would be during source to drain pro-gramming, resulting in a higher likelihood for voltage over-shoot. Additionally, the lower the VgVt for a given wordline, the faster the cells of that wordline are pushed to Vt, meaning a lower wordline start voltage should be used to avoid overshoot.

In some embodiments, the VgVt profile for a memory device may be generally known. For example, a memory subsystem (such as memory subsystem 110 of FIG. 1) may have one or more maximum start voltage deltas stored for a memory device (such as memory devices 130 and/or 140 of FIG. 1). The maximum start voltage delta is an estimation of the difference between a VgVt for a sampled wordline in a deck or other subdivision and the lowest VgVt (minimum) for that deck or subportion. For example, as shown in FIG. 3, the maximum start voltage delta for the upper deck is represented as the difference between block A upper deck sampled VgVt 202 and block A upper deck wordline start voltage 210. Similarly, as shown in FIG. 3, the maximum start voltage delta for the lower deck is represented as the difference between block A lower deck sampled VgVt 204 and block A lower deck wordline start voltage 212. The maximum start voltage delta is an estimated difference between a sampled voltage value of the memory subportion and the lowest voltage value for the memory subportion. Maximum start voltage delta is an estimation as the actual lowest voltage value for the memory subportion is not known. In some embodiments, the maximum start voltage delta is stored in a memory subsystem controller. For example, the maximum start voltage delta may be stored in a local memory of a memory subsystem controller (e.g., local memory 119 of FIG. 1).

Adaptive wordline voltage manager 113, therefore, samples block A upper deck 205 and determines block A upper deck sampled VgVt 202. As shown in FIG. 2, adaptive wordline voltage manager 113 also samples block A lower deck 215. For example, adaptive wordline voltage manager 113 samples block A lower deck 215 determines block A lower deck sampled VgVt 204. In some embodiments, adaptive wordline voltage manager 113 samples a set of wordlines for each of block A upper deck 205 and block A lower deck 215. For example, adaptive wordline voltage manager 113 samples and stores the calibrated wordline start voltages for one or more of the third through the fifth wordlines for each of block A upper deck 205 and block A lower deck 215 during the programming of block A upper deck 205 and block A lower deck 215. As shown in FIG. 3, the initial few wordlines of a deck may have large VgVt variation from the following wordlines. As such, in some embodiments, adaptive wordline voltage manager 113 samples and stores the calibrated wordline start voltages for wordlines beginning with the second or third wordline of each deck.

In some embodiments, the wordline or set of wordlines to be sampled are predetermined. For example, adaptive word-line voltage manager 113 is programmed to sample the same set of wordlines for each deck (e.g., the third through the fifth wordlines). In some embodiments, adaptive wordline voltage manager 113 samples a different set of wordlines for different decks of a memory block. For example, adaptive wordline voltage manager 113 samples the third through the fifth wordline for lower decks but samples the fifth through the seventh wordline for upper decks.

Using the sampled VgVt for each subdivision of each memory block, adaptive wordline voltage manager 113 determines a wordline start voltage to apply to that subdi-vision. For example, adaptive wordline voltage manager 113 determines block A upper deck wordline start voltage 210 using block A upper deck sampled VgVt 202 and a prede-termined maximum start voltage delta value for the upper deck 205. For example, adaptive wordline voltage manager 113 determines a wordline start voltage according to the following formula: WordlineStartVoltage=SampledVgVt– MaximumStartVoltageDelta, where adaptive wordline volt-age manager 113 receives the predetermined maximum start voltage delta (e.g., from a local storage on a memory subsystem controller). Similarly, adaptive wordline voltage manager 113 determines block A lower deck wordline start voltage 212 using block A lower deck sampled VgVt 204 and the maximum start voltage delta for block A lower deck 215.

In some embodiments, the maximum start voltage delta is different for different decks and different program erase cycles. For example, the maximum start voltage deltas for upper and lower decks and different program erase cycles are set according to the table below.

| Program Erase Cycles | Maximum Start Voltage Delta Lower Deck (mV) | Maximum Start Voltage Delta Upper Deck (mV) |
|---|---|---|
| 10,000 | 40 | 56 |
| 20,000 | 36 | 51 |
| 30,000 | 32 | 46 |
| 40,000 | 29 | 40 |
| 50,000 | 28 | 38 |
| 60,000 | 26 | 35 |

Adaptive wordline voltage manager 113 programs block A upper deck 205 using the block A upper deck wordline start voltage 210. For example, adaptive wordline voltage manager 113 applies programming pulses to block A upper deck 205 beginning with block A upper deck wordline start voltage 210. Adaptive wordline voltage manager 113 also programs block A lower deck 215 using block A lower deck wordline start voltage 212. For example, adaptive wordline voltage manager 113 applies programming pulses to block A lower deck 215 beginning with block A lower deck wordline start voltage 212.

In some embodiments, adaptive wordline voltage manager 113 programs block A upper deck 205 using the block A upper deck wordline start voltage 210 in response to determining that there is no calibrated wordline start voltage stored. For example, adaptive wordline voltage manager 113 calibrates the wordline start voltage by determining a wordline start voltage for each consecutive wordline in a write request. In one embodiment, adaptive wordline voltage manager 113 starts the calibration for the first wordline of block A using a start voltage of 0 millivolts (mV) and determines a wordline start voltage based on the calibration. For example, adaptive wordline voltage manager 113 determines the calibrated wordline start voltage based on the sampled VgVt for the first wordline. Adaptive wordline voltage manager 113 then starts the calibration for the second wordline of block A using the determined wordline start voltage and determines a next wordline start voltage based on the calibration. Adaptive wordline voltage manager 113 stores the calibrated wordline start voltage for the most recent wordline in a local media controller (e.g., in local media controllers 135 of memory device 130 of FIG. 1). Adaptive wordline voltage manager 113 clears the calibrated wordline start voltage when block A is fully programmed. Adaptive wordline voltage manager 113 may also clear the calibrated wordline start voltage when writing to a different targeted block. For example, upon writing to block B, adaptive wordline voltage manager 113 clears the calibrated wordline start voltage for block A. In response to determining that there is no calibrated wordline start voltage stored (e.g., in local media controllers 135 of memory device 130 of FIG. 1), adaptive wordline voltage manager 113 programs block A upper deck 205 using the block A upper deck wordline start voltage 210. This allows adaptive wordline voltage manager 113 to use an approximation of the wordline start voltage without having to recalibrate from the very beginning of the block.

In some embodiments, adaptive wordline voltage manager 113 stores block A upper deck wordline start voltage 210. For example, adaptive wordline voltage manager 113 stores block A upper deck wordline start voltage 210 in a local memory (e.g., local memory 119 of FIG. 1). In some embodiments, adaptive wordline voltage manager 113 receives wordline start voltages for a set of wordlines from memory device 130 and stores the received wordline start voltage in a local memory. Adaptive wordline voltage manager 113 also stores block A lower deck wordline start voltage 212. For example, adaptive wordline voltage manager 113 saves block A lower deck wordline start voltage 212 in a local memory (e.g., local memory 119 of FIG. 1). In some embodiments, adaptive wordline voltage manager 113 stores block A upper deck wordline start voltage 210 and block A lower deck wordline start voltage 212 for the duration of a program operation. For example, adaptive wordline voltage manager 113 uses block A upper deck wordline start voltage 210 and block A lower deck wordline start voltage 212 for a current program operation but does not use block A upper deck wordline start voltage 210 and block A lower deck wordline start voltage 212 for future program operations. Adaptive wordline voltage manager 113 thereby samples the decks for each program operation so that the sampled VgVt values reflect the current wear for the decks.

In some embodiments, adaptive wordline voltage manager 113 resamples block A upper deck 205 and block A lower deck 215 in response to a resampling variable meeting a threshold value. For example, adaptive wordline voltage manager 113 uses the stored block A upper deck wordline start voltage 210 and block A lower deck wordline start voltage 212 until determining that a resampling variable has met a threshold value. The resampling variables can include, for example, one or more of an amount of time since a previous sampling, a number of operations for the subportion of memory, a temperature of the subportion of memory, etc. In response to determining that one or more of these resampling variables has met a threshold value, adaptive wordline voltage manager 113 resamples block A upper deck 205 and block A lower deck 215 to determine updated sampled VgVt values and also updated wordline start voltage values.

In some embodiments, adaptive wordline voltage manager 113 samples block B upper deck 225 and block B lower deck 235 to determine block B upper deck sampled VgVt 206 and block B lower deck sampled VgVt 208. For example, adaptive wordline voltage manager 113 samples a select number of wordlines for block B upper deck 225 and block B lower deck 235 as described above with reference to block A. In some embodiments, adaptive wordline voltage manager 113 samples wordlines in block B upper deck 225 in the same relative position as the sampled wordlines for block A upper deck 205. For example, adaptive wordline voltage manager 113 determines block A upper deck sampled VgVt 202 by sampling one or more of the third through fifth wordlines of block A upper deck 205 and determines block B upper deck sampled VgVt 206 by sampling one or more of the third through fifth wordlines of block B upper deck 225.

Adaptive wordline voltage manager 113 determines wordline start voltages for block B upper deck 225 and block B lower deck 235 in a manner similar to the description above. For example, adaptive wordline voltage manager 113 determines block B upper deck wordline start voltage 214 using block B upper deck sampled VgVt 206 and a maximum start voltage delta for block B upper deck 225. In some embodiments, the maximum start voltage delta for block B upper deck 225 is the same as the maximum start voltage delta for block A upper deck 205. Adaptive wordline voltage manager 113 also determines block B lower deck wordline start voltage 216 using block B lower deck sampled VgVt 208 and a maximum start voltage delta for block B lower deck 235. In some embodiments, the maximum start voltage delta for block B lower deck 235 is the same as the maximum start voltage delta for block A lower deck 215.

FIG. 4 is a flow diagram of an example method 400 to determine adaptive wordline start voltage using wordline sampling, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the adaptive wordline voltage manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing device determines whether a wordline start voltage for the current deck is stored. For example, adaptive wordline voltage manager 113 receives a write command from a host system (e.g., host system 120 of FIG. 1) and determines which deck of a memory block the write command is targeting. In one embodiment, adaptive wordline voltage manager 113 translates a logical address received from the host system for the write command into a physical address and determines whether a start voltage for that physical address is stored (e.g., stored in local memory 119). In some embodiments, the processing device does not determine whether a wordline start voltage is stored and proceeds directly to operation 410 upon receiving a write command from a host system. If the processing device determines that a start voltage for the current deck is not stored, the method 400 proceeds to operation 410. If the processing device determines that a start voltage for the current deck is stored, the method 400 proceeds to operation 430.

At operation 410, the processing device determines, by sampling a wordline set for the current deck, a sampled voltage value. For example, as explained with reference to FIGS. 2-3, adaptive wordline voltage manager 113 samples a wordline set for the current deck to determine a sampled VgVt value for the current deck. In some embodiments, the wordline set is a predetermined number of wordlines for a deck. For example, adaptive wordline voltage manager 113 samples the third through the fifth wordlines of the current deck.

At operation 415, the processing device receives a maximum start voltage delta. For example, adaptive wordline voltage manager 113 receives a maximum start voltage delta for the current deck from a local memory (e.g., reads the value from local memory 119 of FIG. 1). In some embodiments, adaptive wordline voltage manager 113 selects a maximum start voltage delta based on whether the current deck is an upper deck or a lower deck. For example, local memory may include two maximum start voltage deltas, a maximum start voltage delta for an upper deck and a maximum start voltage delta for a lower deck. In such embodiments, adaptive wordline voltage manager 113 receives the maximum start voltage delta based on the current deck. In some embodiments, adaptive wordline voltage manager 113 receives the same maximum start voltage delta value regardless of whether the current deck is an upper deck or a lower deck. For example, local memory stores only one maximum start voltage delta value.

At operation 420, the processing device determines a start voltage for the current deck using the sampled voltage value and the maximum start voltage delta. For example, as described above, adaptive wordline voltage manager 113 subtracts the maximum start voltage delta from the sampled voltage value to obtain the start voltage for the current deck. The processing device is able to save significant time and resources by limiting the sampling to a select number of wordlines while reducing the likelihood of voltage overshoot by still taking into account the VgVt variation among wordlines in the deck through use of the maximum start voltage delta.

At operation 425, the processing device programs the current deck using the determine start voltage. For example, adaptive wordline voltage manager 113 applies programming pulses beginning with the determined start voltage to the current deck to program the current deck according to the received write command. In some embodiments, the processing device stores the determined start voltage value. For example, adaptive wordline voltage manager 113 stores the determined start voltage value in a local memory (e.g., local memory 119 of FIG. 1).

At operation 430, the processing device retrieves the start voltage for the current deck. For example, adaptive wordline voltage manager 113 retrieves the start voltage value (e.g., previously determined via operations 410-420) for the current deck from a local memory (e.g., local memory 119 of FIG. 1).

Figure 5:
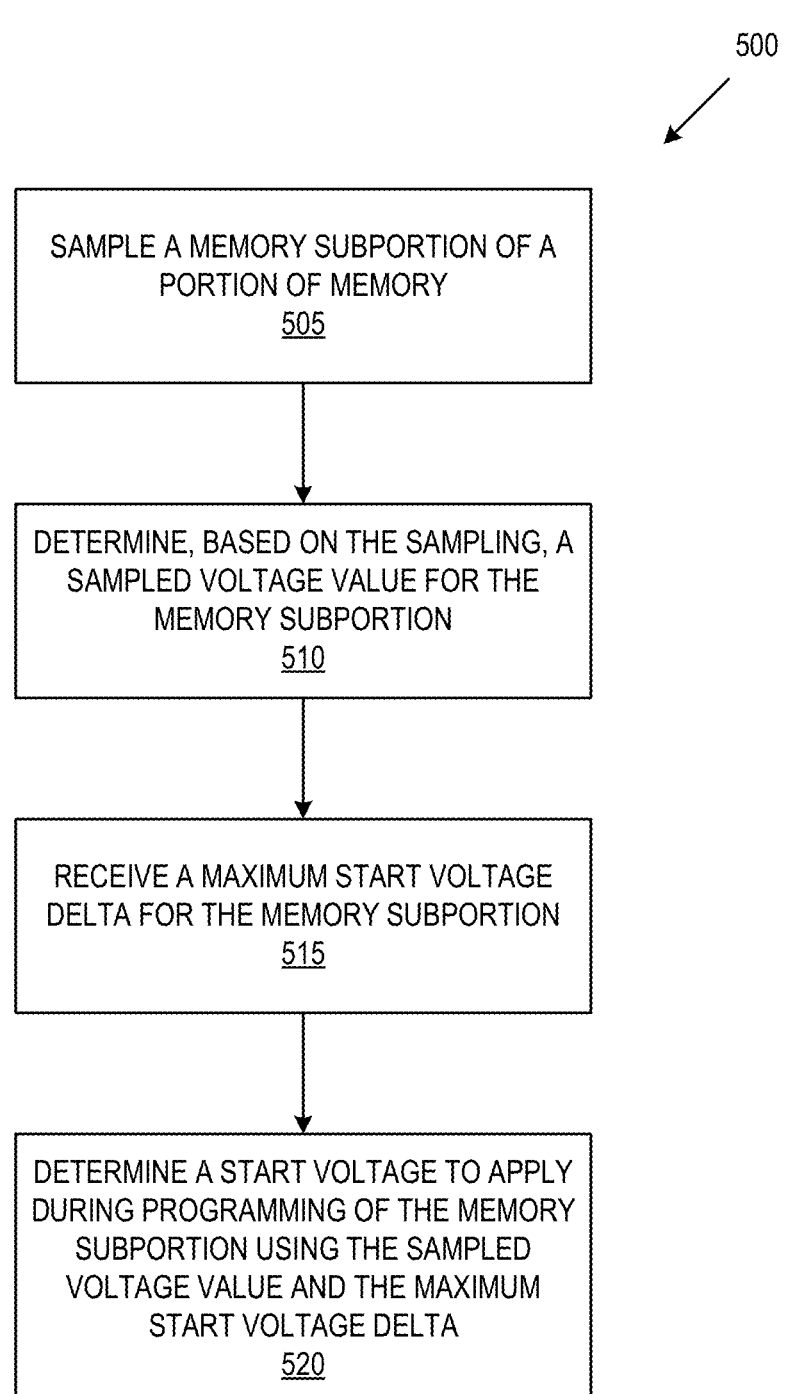
FIG. 5 is another flow diagram of an example method to determine adaptive wordline start voltage using wordline sampling in accordance with some embodiments of the present disclosure.

FIG. 5 is another flow diagram of an example method 500 to determine adaptive wordline start voltage using wordline sampling, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the adaptive wordline voltage manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, the processing device samples a memory subportion of a portion of memory. For example, adaptive wordline voltage manager 113 samples a deck of a memory block to determine a sampled VgVt value for the deck. Further details with regard to sampling a memory subportion are discussed with reference to FIGS. 2-4.

At operation 510, the processing device determines, based on the sampling, a sampled voltage value for the memory subportion. For example, adaptive wordline voltage manager 113 determines a sampled VgVt value (e.g., block A upper deck sampled VgVt 202 of FIG. 2) for a deck of a memory block by sampling the deck. Further details with regard to determining a sampled voltage value are discussed with reference to FIGS. 2-4.

At operation 515, the processing device receives a maximum start voltage delta for the memory subportion. For example, adaptive wordline voltage manager 113 receives a maximum start voltage delta for the current deck from a local memory (e.g., reads the value from local memory 119 of FIG. 1). In some embodiments, adaptive wordline voltage manager 113 selects a maximum start voltage delta based on whether the current deck is an upper deck or a lower deck. For example, local memory may include two maximum start voltage deltas, a maximum start voltage delta for an upper deck and a maximum start voltage delta for a lower deck. Further details with regard to determining a maximum start voltage delta are discussed with reference to FIGS. 2-4.

At operation 520, the processing device determines a start voltage to apply during programming of the memory subportion using the sampled voltage value and the maximum start voltage delta. For example, adaptive wordline voltage manager 113 determines a start voltage to apply to a deck of a memory block using a sampled VgVt value for that deck. In some embodiments, the processing device determines the start voltage to apply using a maximum start voltage delta. For example, adaptive wordline voltage manager 113 determines a start voltage by subtracting a maximum start voltage delta from the sampled voltage value. Further details with regard to determining a start voltage to apply during programming of the memory subportion are discussed with reference to FIGS. 2-4.

Figure 6:
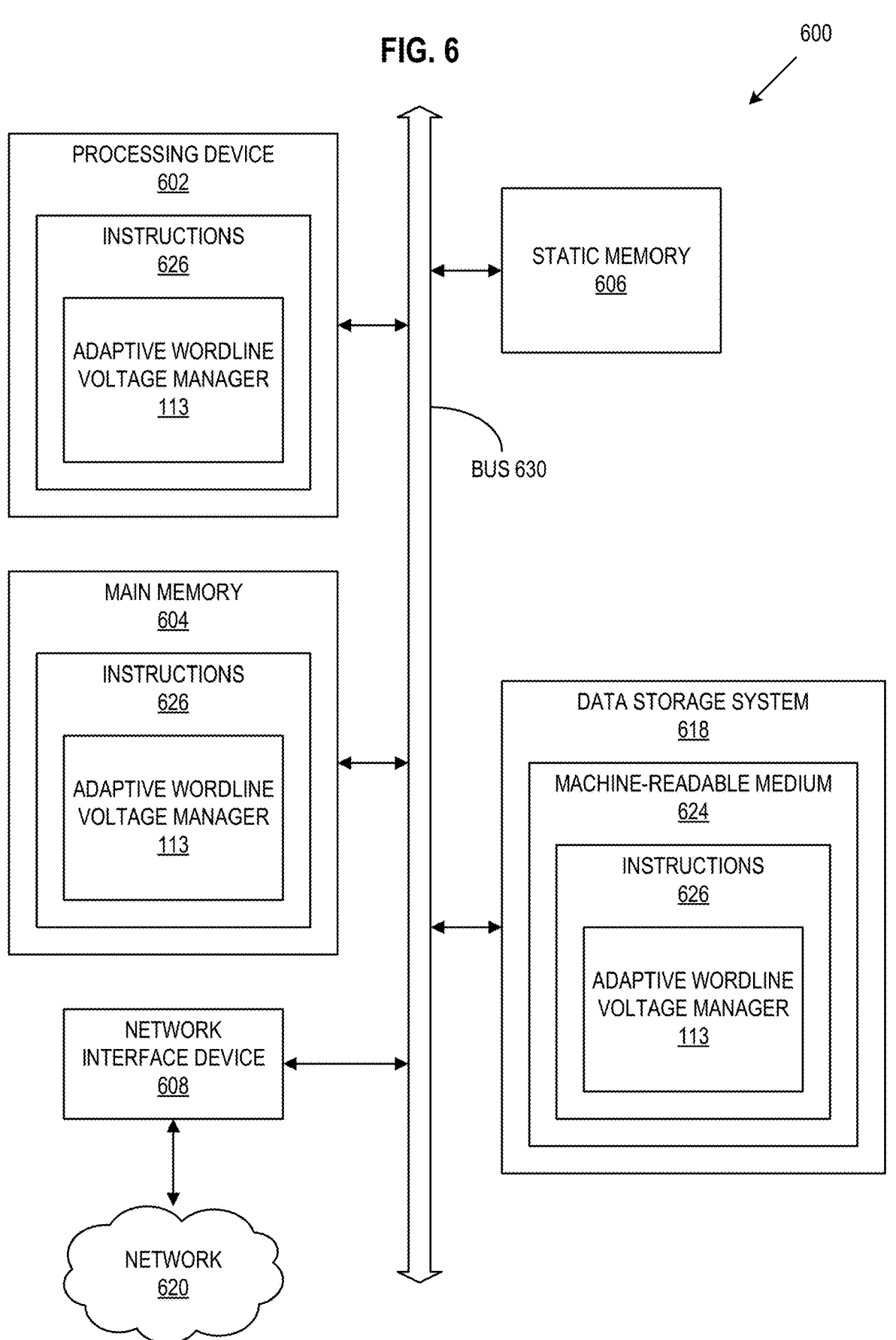
FIG. 6 is a block diagram of an example computer system in which embodiments of the present disclosure may operate.

FIG. 6 illustrates an example machine of a computer system 600 within which a set of instructions for causing the machine to perform any one or more of the methodologies discussed herein can be executed. In some embodiments, the computer system 600 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the adaptive wordline voltage manager 113 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a smart device, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random-access memory (DRAM) such as synchronous DRAM (SDRAM) or Rambus DRAM (RDRAM), etc.), a static memory 606 (e.g., flash memory, static random-access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626, constituting machine-readable storage media, can also reside, completely or at least partially, within the main memory 604 and/or within the processing device 602 during execution thereof by the computer system 600, the main memory 604 and the processing device 602. The machine-readable storage medium 624, data storage system 618, and/or main memory 604 can correspond to the memory subsystem 10 of FIG. 1.

In one embodiment, the instructions 626 include instructions to implement functionality corresponding to an adaptive wordline voltage determiner (e.g., the adaptive wordline voltage manager 113 of FIG. 1). While the machine-readable storage medium 624 is shown in an example embodiment to be a single medium, the term "machine-readable storage medium" should be taken to include a single medium or multiple media that store the one or more sets of instructions (e.g., instructions 626). The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented method 400 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random-access memories (RAMs), EPROMs, EEPROMs, magnetic or optical cards, or any type of media suitable for storing electronic instructions coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   sampling a memory subportion of a portion of memory, wherein the memory subportion comprises a plurality of wordlines;
   determining, based on the sampling, a sampled voltage value for the memory subportion;
   receiving a maximum start voltage delta for the memory subportion, wherein the maximum start voltage delta is an estimated difference between the sampled voltage value and a lowest voltage value for the memory subportion; and
   determining a start voltage to apply during programming of the memory subportion using the sampled voltage value and the maximum start voltage delta.

2. The method of claim 1, further comprising:
   programming the memory subportion using the start voltage.

3. The method of claim 1, wherein determining the start voltage comprises subtracting the maximum start voltage delta from the sampled voltage value to obtain the start voltage.

4. The method of claim 1, wherein the programming of the memory subportion comprises programming the memory subportion using a drain to source algorithm.

5. The method of claim 1, further comprising:
   receiving, from a host system, a write command targeting the memory subportion, wherein determining the start voltage comprises retrieving the start voltage in response to receiving the write command.

6. The method of claim 1, wherein the portion of memory is a memory block and the memory subportion is a deck of the memory block and wherein the sampling comprises sampling a wordline of the deck.

7. The method of claim 6, further comprising:
   determining the wordline based on the memory subportion, wherein the wordline is one of a first five wordlines of the deck.

8. A non-transitory computer-readable storage medium comprising instructions that, when executed by a processing device, cause the processing device to:
   sample a memory subportion of a portion of memory, wherein the memory subportion comprises a plurality of wordlines;
   determine, based on the sampling, a sampled voltage value for the memory subportion;
   receive a maximum start voltage delta for the memory subportion, wherein the maximum start voltage delta is an estimated difference between the sampled voltage value and a lowest voltage value for the memory subportion; and
   determine a start voltage to apply during programming of the memory subportion using the sampled voltage value and the maximum start voltage delta.

9. The non-transitory computer-readable storage medium of claim 8, wherein the processing device is further to:
   program the memory subportion using the start voltage.

10. The non-transitory computer-readable storage medium of claim 8, wherein determining the start voltage comprises subtracting the maximum start voltage delta from the sampled voltage value to obtain the start voltage.

11. The non-transitory computer-readable storage medium of claim 8, wherein the programming of the memory subportion comprises programming the memory subportion using a drain to source algorithm.

12. The non-transitory computer-readable storage medium of claim 8, wherein the processing device is further to:
   receive, from a host system, a write command targeting the memory subportion, wherein determining the start voltage comprises retrieving the start voltage in response to receiving the write command.

13. The non-transitory computer-readable storage medium of claim 8, wherein the portion of memory is a memory block and the memory subportion is a deck of the memory block and wherein the sampling comprises sampling a wordline of the deck.

14. The non-transitory computer-readable storage medium of claim 13, wherein the processing device is further to:
   determine the wordline based on the memory subportion, wherein the wordline is one of a first five wordlines of the deck.

17

15. A system comprising:

a plurality of memory devices; and a processing device, operatively coupled with the plurality of memory devices, to:

sample a memory subportion of a portion of memory, wherein the memory subportion comprises a plurality of wordlines;

determine, based on the sampling, a sampled voltage value for the memory subportion;

receive a maximum start voltage delta for the memory subportion, wherein the maximum start voltage delta is an estimated difference between the sampled voltage value and a lowest voltage value for the memory subportion;

determine a start voltage to apply during programming of the memory subportion using the sampled voltage value; and program the memory subportion using the start voltage and the maximum start voltage delta.

16. The system of claim 15, wherein determining the start voltage comprises subtracting the maximum start voltage delta from the sampled voltage value to obtain the start voltage.

17. The system of claim 15, wherein the programming of the memory subportion comprises programming the memory subportion using a drain to source algorithm.

18. The system of claim 15, wherein the processing device is further to:

receive, from a host system, a write command targeting the memory subportion, wherein determining the start voltage comprises retrieving the start voltage in response to receiving the write command.

19. The system of claim 15, wherein the portion of memory is a memory block and the memory subportion is a deck of the memory block and wherein the sampling comprises sampling a wordline of the deck.

20. The system of claim 19, wherein the processing device is further to:

determine the wordline based on the memory subportion, wherein the wordline is one of a first five wordlines of the deck.

* * * * *